United States Patent [19]

Hulmes et al.

[11] 3,810,300

[45] May 14, 1974

[54] ELECTRICAL CIRCUIT ASSEMBLIES

[75] Inventors: Harold Hulmes, Cheadle; John Robert Pickin, Alderley Edge, both of England

[73] Assignee: Ferranti Limited, Lancashire, England

[22] Filed: July 21, 1972

[21] Appl. No.: 273,994

Related U.S. Application Data

[63] Continuation of Ser. No. 36,760, May 13, 1970, abandoned.

[30] Foreign Application Priority Data

May 20, 1969 Great Britain ................. 25693/69

[52] U.S. Cl. ..................................... 29/574, 29/588

[51] Int. Cl. ............................................. B01j 17/00

[58] Field of Search .......... 29/574, 577, 588, 576 S, 29/627; 174/52 PE, DIG. 3

[56] References Cited

UNITED STATES PATENTS

| | | | |
|---|---|---|---|
| 2,613,252 | 10/1952 | Heibel | 29/627 |
| 3,225,260 | 12/1965 | Brochier | 174/52 PE |
| 3,444,441 | 5/1969 | Helda | 174/52 PE |
| 3,439,238 | 4/1969 | Birchler | 29/588 |
| 3,490,141 | 1/1970 | Leak | 29/577 |
| 3,494,023 | 2/1970 | Dorendorf | 29/588 |

*Primary Examiner*—W. C. Tupman

*Attorney, Agent, or Firm*—Cameron, Kerkam, Sutton, Stowell & Stowell

[57] ABSTRACT

An electrical circuit assembly having a plurality of components and including at least one semiconductor device is formed, without employing a printed circuit board as is conventional with such arrangements, by mounting the semiconductor device on a lead frame, encapsulating the semiconductor device to form together with conductors associated with the semiconductor device a unitary construction, and providing a completed assembly of sufficient strength, after all the conductors of the lead frame have been rendered electrically discrete, by connecting the remainder of the assembly to the unitary construction and/or by encapsulating at least another part of the assembly; it being possible thereby also to test the different components either individually or in appropriate combinations during the manufacture of the assembly.

18 Claims, 3 Drawing Figures

ELECTRICAL CIRCUIT ASSEMBLIES

This is a continuation of application, Ser. No. 36,760, filed May 13, 1970 and now abandoned.

This invention relates to electrical circuit assemblies, each assembly having a plurality of components including at least one semiconductor device, with each component mounted on a network of conductors.

It is known to mount a single, initially-unencapsulated semiconductor device on a lead frame comprising a preformed network of conductors. The semiconductor device and part of each associated conductor is then encapsulated in a potting compound and the conductors are rendered electrically discrete. The encapsulated semiconductor device may then be mounted with other components on a printed circuit board to form a desired electrical circuit assembly.

It is an object of the present invention to provide an electrical circuit assembly which does not employ a printed circuit board.

According to the present invention an electrical circuit assembly having a plurality of components including at least one semiconductor device comprises a network of conductors in the form of a lead frame formed from a metal sheet, said semiconductor device being mounted on said conductor network, and a part of the assembly including said semiconductor device and an adjacent part of said conductor network being encapsulated in a potting compound such that a plurality of conductors associated with said semiconductor device are supported by the encapsulation, providing a unitary construction.

According to another aspect of the present invention a method of manufacturing an electrical circuit assembly having a plurality of components, including at least one semiconductor device, includes the following steps in any appropriate sequence, mounting said semiconductor device on a preformed conductor network comprising a lead frame formed from a metal sheet, forming a unitary construction by encapsulating in a potting compound a part of the assembly including said semiconductor device and an adjacent part of said conductor network, mounting the other components on the conductor network, and rendering the conductors electrically discrete.

Figure 1:
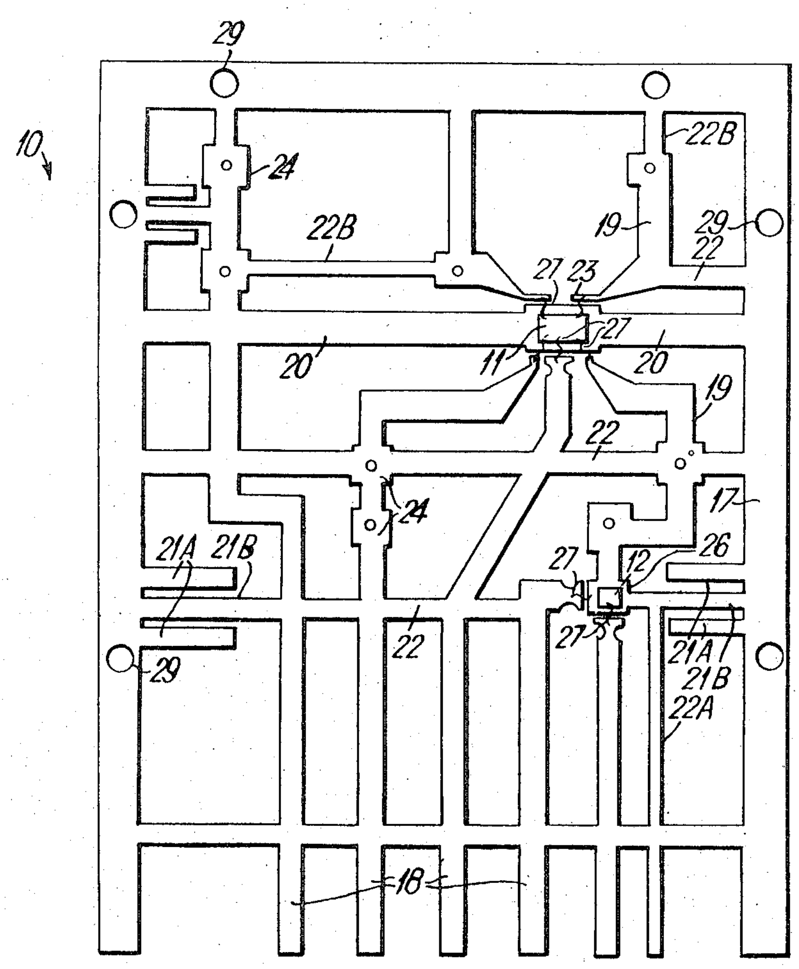
Figure 2:
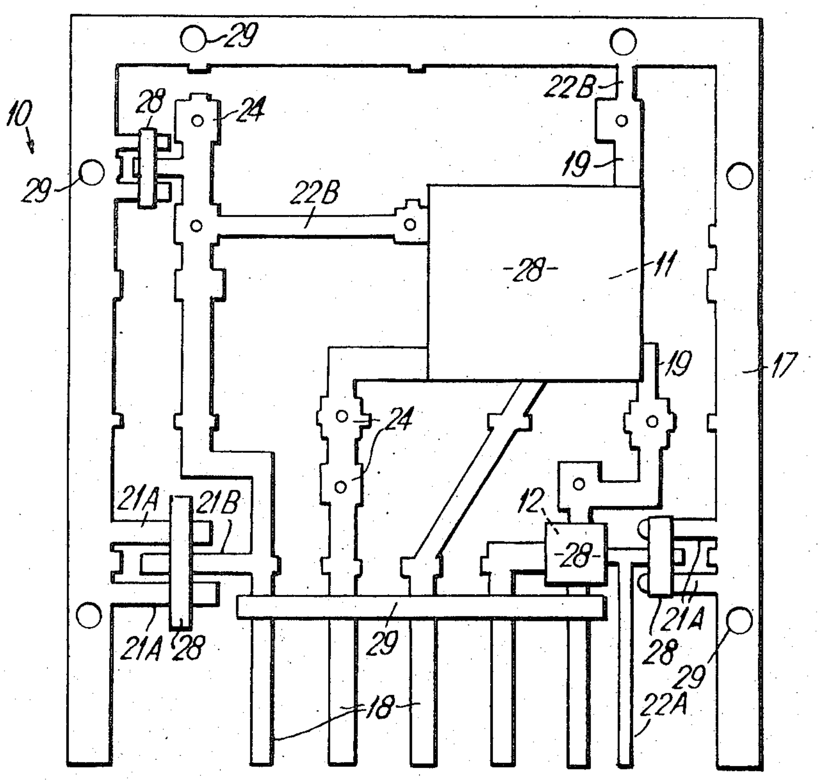
Figure 3:
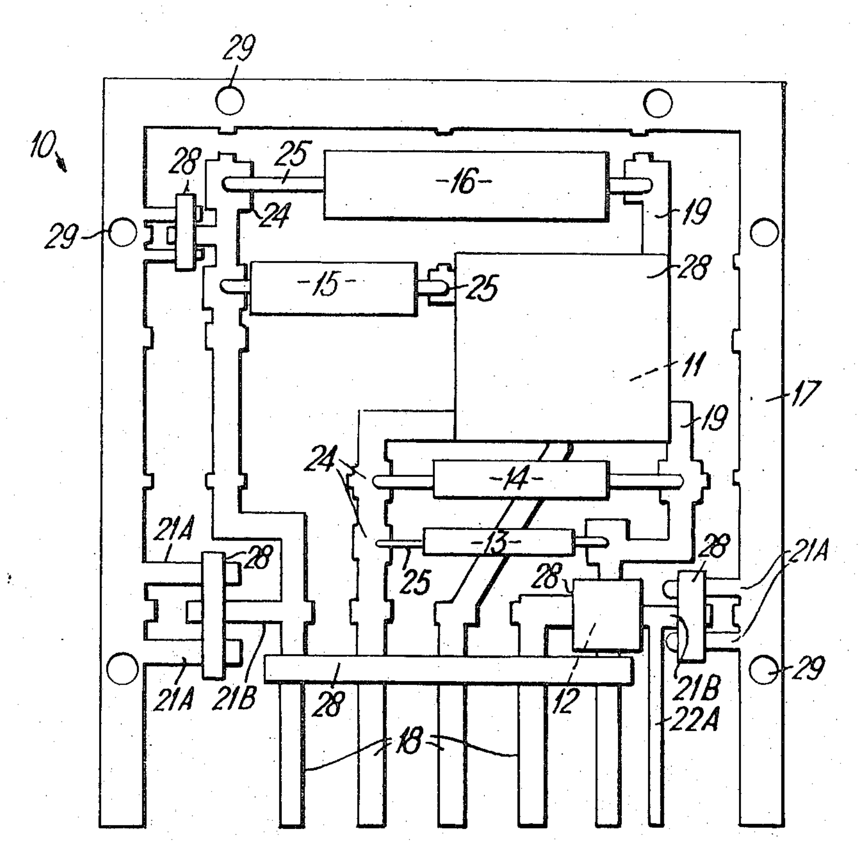

The present invention will now be described by way of example with reference to the accompanying drawings, in which FIG. 1 is a plan view of a lead frame comprising a preformed network of conductors with two unencapsulated semiconductor devices mounted on the conductor network;

FIG. 2 shows the semiconductor device encapsulated in a potting compound and the lead frame now of a form which enables the semiconductor devices to be tested individually, and FIG. 3 shows other components mounted on the conductor network, the arrangement being such that the performance of the whole assembly may be tested before it is encapsulated.

The lead frame 10 shown in FIG. 1 and comprising a preformed network of conductors is employed in forming an amplifier circuit, two silicon semiconductor devices comprising an integrated circuit 11 and a discrete transistor 12 being mounted on the conductor network and being included in the assembly. Other components comprising a resistor 13 and capacitors 14, 15 and 16 (shown in FIG. 3) are also included in the assembly. The conductor network is within a boundary frame 17 of the lead frame 10 and the conductors comprise leads 18 which are required to extend externally of the assembly and also electrical interconnections 19 between the components 11 to 16. The lead frame, in addition, has supports 20, parts 21 and strengthening pieces 22. The supports 20 are connected to a land 23 also provided by the lead frame, and one major face of the silicon wafer of the integrated circuit 11 is alloyed to the land 23. The conductors 18 and 19 have variable widths and are provided with parts 24 of enlarged width and having central apertures, through which apertures wire leads 25 of the components 13 to 16 are arranged to extend. One major face of the silicon wafer of the transistor 12 is alloyed to an enlarged end 26 of one of the conductors 19 and in this way the collector contact of the transistor is provided. The ends of the other conductors 18 and 19 adjacent to the semiconductor devices 11 and 12 are tapered and terminate in contact areas to which small-diameter gold wires 27 are bonded by thermo-compression techniques. The gold wires 27 also are bonded to contacts provided on the non-alloyed major faces of the semiconductor wafers. The parts 20 to 22 of the lead frame are generally of smaller width than the conductors 18 and 19 and may be broken and partially removed in an easy way during the manufacture of the assembly.

The lead frame 10 may be made by stamping out the desired apertures in a thin sheet of a suitable nickel-iron-cobalt alloy, or by selectively etching such a sheet, and is coated with gold. The semiconductor devices 11 and 12 are mounted on the lead frame 10 by a conventional alloying machine.

As shown in FIG. 2 parts of the assembly including the semiconductor devices 11 and 12 and adjacent parts of the conductor network are encapsulated in a potting compound 28 to provide two unitary constructions. The encapsulations strengthen the assembly at least during its manufacture. The leads 18 are also partially cast in the potting compound 28. Thus, the potting compound also comprises a medium for embedding a further part of the assembly, serving to secure conductors together at least during the manufacture of the assembly whilst the conductors are electrically isolated from each other. The potting compound also partially encapsulates three groups of three strengthening pieces 21, which groups are distributed along three edges of the boundary frame 17. Each group comprises two spaced stub parts 21A integral with the boundary frame 17 and an integral extension piece 21B of an adjacent conductor 18 or 19 and extending between the boundary frame and the conductor between the parts 21A. The potting compound 28 secures the parts of each group together and hence the extension piece 21B may be electrically isolated from the boundary frame 17 by being broken between the boundary frame and the part of this piece embedded in the potting compound.

The lead frame 10 is then arranged to take the form shown in FIG. 2, by breaking each extension piece 21B in the manner referred to above, by breaking the supports 20 and by breaking selected ones of the strenghtening pieces 22. With the lead frame in this form each conductor 18 or 19 connected to a contact of a semiconductor device 11 or 12 is rendered electrically discrete, and each semiconductor device is tested individually by employing the leads 18, the electrical interconnections 19, the boundary frame 17, strengthening pieces 22A and a strengthening piece 22B which extends, from a conductor 19, adjacent to the leads 18. The leads 18 are rendered electrically discrete by cutting off one edge of the lead frame and adjacent strengthening pieces 22, however, it will be appreciated that these strengthening pieces may be broken.

After the semiconductor devices have been tested the strengthening pieces 22A are broken and the wire leads 25 of the components 13 to 16 are soldered to the parts 24 of the conductor network to form the amplifier circuit. Alternatively, the wire leads 25 may be welded to the parts 24. The arrangement is then as shown in FIG. 3 and the electrical circuit may be tested, employing only the conductor network 18 and 19. A cross-over within the circuit assembly is provided by causing the components 13 and 14 to span, but to be electrically isolated from, a lead 18.

The electrical circuit assembly is then encapsulated in a suitable potting compound, different from the potting compound employed in encapsulating the semiconductor devices, the heat and pressure employed in curing this encapsulant being such that the capacitors 14 to 16 are not damaged. Subsequently the boundary frame 17 is removed by breaking the extension pieces 21B close to their associated conductors.

The boundary frame 17 may be left in the completed assembly for strengthening purposes, or in another arrangement it may form at least one conductor. The transistor 12 or the integrated circuit 11 may be encapsulated before being mounted on the conductor network.

The conductor network may be bent or curved into any desired shape before any component is mounted thereon.

The circuit assembly may not comprise a complete electrical circuit, but a sub-unit of a complete circuit.

The semiconductor devices may be mounted on the conductor network by employing the so-called "flip-chip" technique.

In a modified arrangement of the circuit assembly different components or combination of components may be tested in isolation of the remainder of the assembly at different appropriate stages in the progressive manufacture of the assembly. The different components may be mounted progressively on the conductor network to allow this progressive testing, but it is essential that a semiconductor device is sufficiently thermally isolated after it is mounted on the lead frame. Thus, it may be possible to replace defective components during the manufacture of the assembly. It may also be possible to test, and remove if found to be defective, a semiconductor device mounted on the lead frame and before it is encapsulated. The sequence of the manufacturing steps may be varied where appropriate, for example, the partial embedding of parts of the conductor network in a casting medium may be obtained in several discrete steps, perhaps before and/or after the encapsulation of the semiconductor devices.

The unitary construction of a semiconductor device and the part of the conductor network encapsulated with it may be formed simultaneously with the encapsulation of the whole assembly, if all the components of the assembly can be encapsulated in the same potting compound as the semiconductor devices. Alternatively, it may be possible to omit the step of encapsulating the whole of the assembly. In addition it may be possible to embed at least a further part of the assembly in a casting medium which is not the potting compound for the semiconductor devices.

Wires may be bonded between the conductors of the assembly to provide temporary or permanent electrical interconnections where desired.

The conductor network may have any desired shape. Thus, for example, an indicator may be provided by forming a spiral conductor.

The electrical circuit assemblies according to the present invention are of a form which enables them to be manufactured and tested by employing automatic apparatus, including progressively testing different parts of the assembly at various stages in the manufacture. An essential requirement in order to obtain this criterion comprises being able to locate accurately the structure of the assembly as it is being manufactured. In the specific embodiment described above the provision initially of a lead frame 10 with a boundary frame 17 facilitates its manufacture by automatic apparatus. In particular the boundary frame 17 is provided with locating holes 29, which enables the assembly to be positively and accurately located at all the stages of its manufacture, at least until the circuit is completed and the boundary frame is removed, possibly after the assembly has been wholly encapsulated.

The manufacture of electrical circuit assemblies according to the present invention avoids the use of an insulating support for the conductor network on which the components are mounted.

What we claim is:

1. A method of manufacturing an electrical circuit assembly having a plurality of components, including at least one semiconductor device, includes the following steps, providing a lead frame formed from a metal sheet comprising a preformed network of conductors interconnected to each other through support pieces, mounting said semiconductor device on selected conductors of the preformed network encapsulating said semiconductor device and parts of the conductors adjacent to the said semiconductor device in a potting compound, embedding at least one further part of the lead frame remote from the semiconductor device in a casting medium, selectively removing portions of said support pieces to render the conductors connected to the semiconductor device electrically discrete thereby isolating the encapsulated semiconductor device, testing the performance of the semiconductor device, and subsequently mounting the other components on the conductor network.

2. A method as claimed in claim 1 in which the performance of at least one other component is tested when mounted on the conductor network.

3. A method as claimed in claim 2 in which the lead frame includes a boundary frame around the preformed network of conductors, and the boundary frame of the lead frame is employed as a conductor whilst a component is being tested.

4. A method as claimed in claim 1 in which the performance of at least one combination of components is tested when the components are mounted on the conductor network.

5. A method as claimed in claim 1 in which the casting medium comprises the potting compound for said semiconductor device.

6. A method as claimed in claim 3 in which the further part of the assembly is embedded in the potting compound simultaneously with the encapsulation of said semiconductor device.

7. A method of manufacturing an electrical circuit assembly having a plurality of components, including at least one semiconductor device, includes the following steps, providing a lead frame formed from a metal sheet comprising a preformed network of conductors interconnected to each other through support pieces, embedding in a casting medium a part of the lead frame, selectively removing portions of said support pieces to render selected conductors of the preformed network electrically discrete thereby isolating said part of said lead frame, mounting said semiconductor device on said selected conductors, testing the performance of the semiconductor device, encapsulating said semiconductor device in a potting compound, and subsequently mounting the other components on the conductor network.

8. A method as claimed in claim 7 in which the performance of at least one other component is tested when mounted on the conductor network.

9. A method as claimed in claim 8 in which the lead frame includes a boundary frame around the preformed network of conductors, and the boundary frame of the lead frame is employed as a conductor whilst a component is being tested.

10. A method as claimed in claim 7 in which the performance of at least one combination of components is tested when the components are mounted on the conductor network.

11. A method as claimed in claim 7 in which the casting medium comprises the potting compound for said semiconductor device.

12. A method as claimed in claim 11 in which the further part of the assembly is embedded in the potting compound simultaneously with the encapsulation of said semiconductor device.

13. A method of manufacturing an electrical circuit assembly having a plurality of components, including at least one semiconductor, includes the following steps, providing a lead frame formed from a metal sheet comprising a boundary frame and a network of conductors interconnected to each other and to said boundary frame through support pieces, mounting said semiconductor device on selected conductors of the preformed network, encapsulating said semiconductor device and parts of the conductors adjacent to said semiconductor device in a potting compound, selectively embedding other parts of the conductors remote from the semiconductor device and support pieces in a casting medium and selectively removing portions of said support pieces to selectively break the interconnections between the conductors and the support connections and between the conductors and the boundary frame to render the individual conductors electrically discrete, thereby isolating the encapsulated semiconductor device, testing the performance of the semiconductor device during the manufacture of the assembly and subsequently mounting other components of the circuit on the conductor network.

14. A method as set forth in claim 13 wherein said components and semiconductor device are tested individually.

15. A method as set forth in claim 13 wherein said components and semiconductor device are tested individually or in selected combinations, said tests being performed progressively during the manufacture of the assembly.

16. A method as set forth in claim 13 wherein a boundary frame of the lead frame is employed as a conductor while a component is being tested.

17. A method as claimed in claim 13 wherein said step of selectively embedding support pieces includes insulatively supporting said support pieces to said boundary frame and said step of selectively removing portions of said support pieces includes removal of at least a portion of said support piece between the conductors and the boundary frame such that said conductor network is electrically isolated from said boundary frame.

18. A method as claimed in claim 13 wherein the boundary frame is employed as a conductor during testing and further including the step of separating the boundary frame and the network of conductors and mounted components subsequent to testing.

* * * * *